United States Patent
Peake (10) Patent No.: US 6,664,593 B2
(45) Date of Patent: Dec. 16, 2003

(54) FIELD EFFECT TRANSISTOR STRUCTURE AND METHOD OF MANUFACTURE

(75) Inventor: Steven T. Peake, Warrington (GB)

(73) Assignee: Koninklijke Philips Electronics N.V., Eindhoven (NL)

(*) Notice: Subject to any disclaimer, the term of this patent is extended or adjusted under 35 U.S.C. 154(b) by 0 days.

(21) Appl. No.: 10/099,688

(22) Filed: Mar. 15, 2002

(65) Prior Publication Data

US 2002/0135016 A1 Sep. 26, 2002

(30) Foreign Application Priority Data

Mar. 23, 2001 (GB) .............................. 0107405

(51) Int. Cl.⁷ .................... H01L 29/76; H01L 29/94; H01L 31/062; H01L 31/113; H01L 31/119
(52) U.S. Cl. .............. 257/336; 335/337; 335/339; 335/343; 335/488; 335/492; 335/493
(58) Field of Search .................. 257/335, 336, 257/337, 339, 343, 488, 492, 493

(56) References Cited

U.S. PATENT DOCUMENTS

| 3,845,495 A | 10/1974 | Cauge et al. ............ 357/23 |
| 5,300,448 A | 4/1994 | Merchant et al. ......... 437/41 |
| 5,406,110 A | * 4/1995 | Kwon et al. ............ 257/493 |
| 5,412,241 A | 5/1995 | Merchant ............... 257/409 |
| 6,593,621 B2 | * 7/2003 | Tsuchiko et al. .......... 257/335 |
| 2001/0025987 A1 | * 10/2001 | Akaishi et al. ........... 257/343 |

FOREIGN PATENT DOCUMENTS

| WO | WO 98/49732 | 3/1998 | .......... H01L/29/78 |
| WO | WO 99/35695 | 12/1998 | .......... H01L/29/39 |
| WO | WO 99/56311 | 4/1999 | .......... H01L/21/336 |

OTHER PUBLICATIONS

H. F. F. Jos, "Novel LDMOS Structure for 2 GHz High Power Basestation Application", 28th European Microwave conference Proceedings, Amsterdam, NL, Oct. 6–8, 2001, pp 407–410, XP001042544.

T. Letavic et al, "Lateral Smart–Discrete Process and Devices Based on Thin–Layer Silicon–on–Insulators", Proceedings of the 13th International Symposium on Power Semiconductor Devices and ICS (IPSD ;01), Osaka, JP, Jun. 4–7, 2001, pp. 407–410, XP001042544.

* cited by examiner

Primary Examiner—Ngân V. Ngô
(74) Attorney, Agent, or Firm—Steven R. Biren (57) ABSTRACT

A field effect transistor structure is formed with a body semiconductor layer (1) having source (3), channel (7), drift region (9) and drain (5). An upper metallisation layer (15, 17) is separated from the body by an oxide layer (11). The upper metallisation layer (15, 17) has a gate region (15) arranged over the body and a field plate region (17) arranged over the drift region (9). A source contact (39) is connected to both the source (9) and the field plate region (25).

6 Claims, 9 Drawing Sheets

Fig.1

PRIOR ART

FIELD EFFECT TRANSISTOR STRUCTURE AND METHOD OF MANUFACTURE

CROSS-REFERENCE TO RELATED APPLICATIONS

Not Applicable.

STATEMENT REGARDING FEDERALLY SPONSORED RESEARCH OR DEVELOPMENT

Not Applicable.

INCORPORATION-BY-REFERENCE OF MATERIAL SUBMITTED ON A COMPACT DISC

Not Applicable.

BACKGROUND OF THE INVENTION (1) Field of the Invention

The invention relates to a field effect transistor structure and a method of its manufacture, and in particular to an field insulated gate field effect transistor structure having a drift region and a field plate over the drift region and method of manufacture.

(2) Description of Related Art

In an insulated gate field effect transistor (IGFET) structure, a semiconductor channel region between source and drain is controlled by a gate insulated from the channel. IGFET structures are generally implemented as Metal Oxide Semiconductor (MOS) structures.

A double diffused MOS (DMOS) structure may be used in which a long lateral path, known as the drift region, extends between drain and source diffusions. The drift region attenuates any high voltages applied between drain and source down to around 20 V in the channel region controlled by the gate.

In order to maximise the voltage capability of the transistor, the drift region would ideally be long and or lightly doped. Unfortunately, these properties would mean that the drift region would contribute a relatively high resistance to the overall device when the transistor is on. To address this, it is known to dope the drift region with an appropriate doping profile and to choose its thickness such that the reversed bias junctions between the MOSFET channel and source and between the channel and the substrate deplete the entire drift region of charge carriers when the device is turned off. This creates a uniform electric field in the drift region when a large voltage is applied across the transistor when switched off, which maximises the breakdown voltage since there are no peaks in the electric field to initiate premature avalanche breakdown. The fully depleted drift region is said to be in a RESURF (reduced surface field) condition. In a RESURF structure, the full thickness of the drift region is depleted when the device is turned off.

Figure 1:
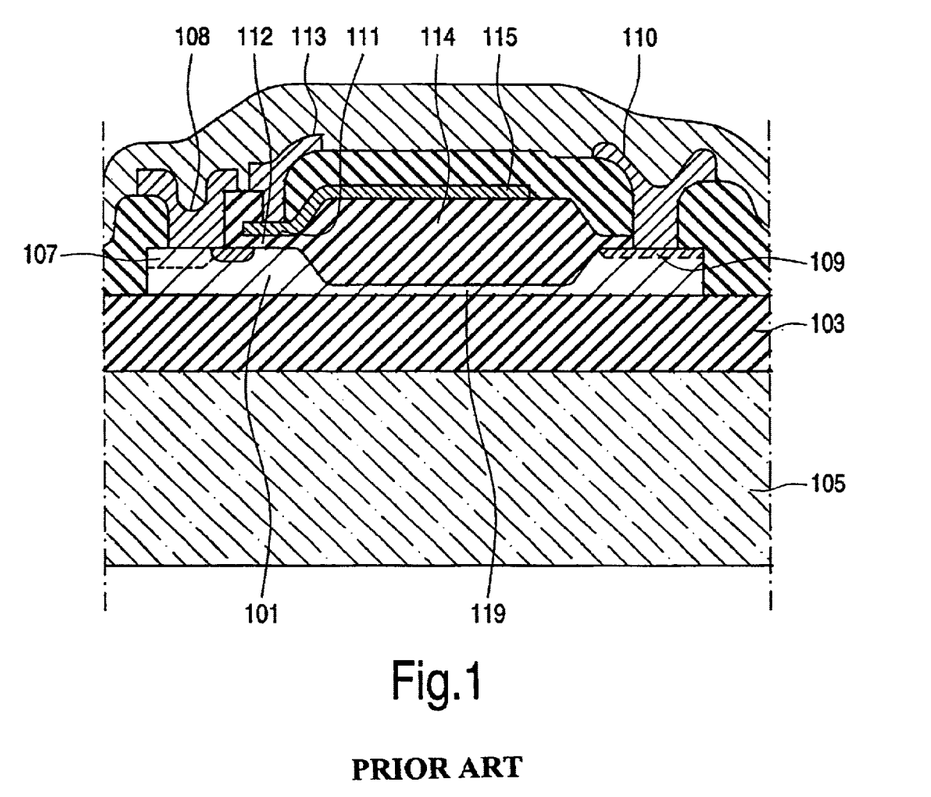
FIG. 1 shows a prior art MOSFET with a gate-connected field electrode.

A lateral MOS device using this technique is described in U.S. Pat. No. 5,412,241 to Merchant, assigned to Philips Electronics North America Corp. The device is illustrated in FIG. 1.

BRIEF SUMMARY OF THE INVENTION

The device is a silicon on insulator (SOI) device having a layer of silicon 101 formed on a buried oxide layer 103 on a semiconductor substrate 105. Source 107 and drain 109 regions are formed in the silicon, and connected to source 108 and drain 110 contacts respectively.

A gate layer 111 is provided over part of the silicon layer 101 which forms a channel, separated from the channel by a gate oxide 112. The gate layer is connected to a gate contact 113. The gate controls conduction between source 107 and drain 109, as is well known.

Between the channel and the drain a drift region 119 is provided in the silicon layer 101 to allow large voltages (e.g. 100 V or more) to be applied between source and drain. A large voltage applied across source and drain may be at least partially dropped in the drift region thus reducing the voltage dropped in the channel.

A field plate 115 is formed integrally with the gate layer 111 over the LOCOS oxide layer 114 and extends laterally over the drift region 119 in the silicon layer 101. When the device is turned off, the field plate depletes the drift region to provide a RESURF effect.

The drift region 119 is protected from the effects of an impinging electric field, such as may be caused by moisture or other charged contaminants on the surface of the wafer, by the field plate 115. Electric fields will terminate on the field plate 115. Further, because the field plate is connected to the gate the drift region 119 may be depleted both from the top and the bottom which means that the device can be designed with a higher doping level in the drift region than would otherwise be possible since the drift region can more readily be depleted. This means that the device of U.S. Pat. No. 5,412,241 can be made with a low on-resistance.

Such silicon on Insulator device structures such as these exhibit, by virtue of their structure, low values of the capacitance between gate and drain ($C_{gd}$) and the charge needed to be supplied through gate and drain to switch the device ($Q_{gd}$). These low values of $C_{gd}$ and $Q_{gd}$ result in a rapid response to changes in gate voltage. However, it would still be beneficial to still further improve switching speed.

The above example relates to a Silicon on Insulator device. However similar considerations apply to other forms of IGFET devices. The need to improve switching speed remains. In particular there is a need for devices that combine improved switching speed with the capability to cope with high voltages between source and drain, preferably in combination with low on-resistances.

According to the invention there is provided an insulated gate field effect transistor structure, comprising: a source region and a drain region laterally spaced in a semiconductor layer; a drift region adjacent to the drain region in the semiconductor layer between the source region and the drain region; a channel arranged in the semiconductor layer between the source region and the drift region; an insulated gate electrode arranged over the channel; a field plate arranged over the drift region separated from the drift region by a capacitance oxide layer; and an electrical interconnection between the source region and the field plate to electrically connect the source region and the field plate.

The source-connected field plate acts as a Faraday screen between gate and drain so reducing $C_{gd}$ and hence the charge needed to be applied through gate and drain to decrease the switching time.

In contrast, the prior art gate-connected field plate has a different function, of protecting the drift region and allowing the drift region to be depleted by a suitable voltage on the gate and hence on the field plate. This prior art arrangement will normally increase $C_{gd}$ and hence increase switching time. In contrast, the source-connected field plate decreases switching time.

At first sight, it might appear that the increase in gate-source capacitance $C_{gs}$ would counteract any benefit of the reduced $C_{gd}$. However, this is not the case. In conventional circuit arrangements, the Miller effect comes into play. The total input capacitance $C_{input}$ is given by the sum of $C_{gs}$ and the Miller capacitance, $C_M=(1+g_MR_L)C_{gd}$, where $R_L$ is the load resistance and $g_M$ the transconductance. This means that the switching speed may be dominated by the contribution from $C_{gd}$ so that the device according to the invention has an improved switching speed.

The transistor structure is preferably formed to have a source and drain of a first conductivity type. The drift region may be of the same conductivity type but of lower doping, and the channel may be formed in a body region of opposite conductivity type. The first conductivity type may be n-type.

The field plate may be fabricated from any convenient conducting material, such as polysilicon, polycide or silicide. The field plate may be doped n+ or p+. The field plate may conveniently made from the same layer as the gate electrode.

The drift region may be linearly graded, i.e. it may have a concentration of dopant that varies linearly, decreasing away from the drain. This may result in an improved breakdown performance compared with a drift region of constant concentration.

Preferably, the doping concentrations are such that the depletion region spreads throughout the drift region when the transistor is turned off, that is to say the transistor is a reduced surface field (RESURF) transistor. The depletion region may extend into the body and drain.

In embodiments, a device according to the invention may be formed from a substrate having source and drain diffusions and a graded drift region of a first conductivity type embedded in it. In such devices, a backside contact may be formed on the substrate to allow the substrate may be biased to the source voltage to optimise the performance.

Alternatively, embodiments of the invention may be implemented in a SOI structure, with a substrate, a buried oxide layer on the substrate and a silicon layer deposited on the buried oxide layer. Source, drain, channel and drift regions may be formed from implantations in the deposited silicon layer. Such SOI structures offer advantages such as intrinsically lower capacitance.

The invention also relates to a method of manufacturing a transistor structure including, in any order, the steps of: forming a drift region and a channel region in a semiconductor body layer; forming an oxide layer over the semiconductor body layer; forming an upper conductive layer over the oxide layer, the upper conductive layer defining a gate electrode and a field plate; diffusing source and drain diffusions to form source and drain in the semiconductor body layer; and depositing a metallisation layer defining a source contact connected to the source region and to the field plate region, a gate contact connected to the gate region and a drain contact connected to the drain region.

BRIEF DESCRIPTION OF THE SEVERAL VIEWS OF THE DRAWINGS

Embodiments of the invention will now be described, purely by way of example, with reference to the accompanying drawings, in which.

It should be noted that all the figures are diagrammatic, and not to scale. The same reference numerals are generally used to refer to corresponding or similar features in different or modified embodiments.

DETAILED DESCRIPTION OF THE INVENTION

Referring to FIG. 2, an exemplary embodiment of a lateral double diffused MOSFET according to the invention is manufactured on a semiconductor substrate 1. Referring to FIG. 2a, the semiconductor substrate 1 is doped to have a source region 3, a channel region 7, a drift region 9 and a drain region 5. The body region 7 is adjacent to the source region 3 and the drift region 9 is arranged between the channel region 7 and the drain region 5. The channel of the MOSFET is formed from the body region 7 between source region 3 and the drift region 9.

Figure 2A:
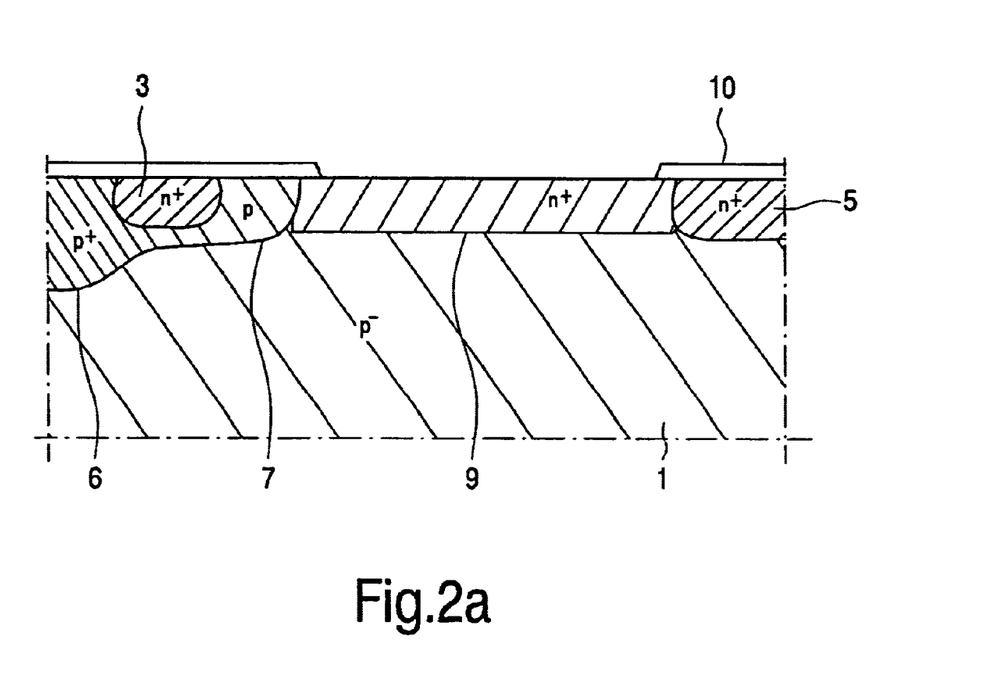
FIG. 2 shows a side view of a device according to a first embodiment of the invention.

In this embodiment the source region 3, the drain region 5, the drift region 9 and the channel 7 are formed by diffusions of dopants in the substrate. A first p diffusion is carried out using a first mask to form the body region 7 and a p+ diffusion 6 is formed on one side of the p diffusion 7. The p+ diffusion acts as a good ohmic contact from source to body and its use may increase the robustness of the structure. Then n+ diffusions are performed using a second mask to form the source region 3 and the drain region 5, the channel 7 being arranged between source region 3 and drain region 5 with the p+ diffusion 6 on the other side of the source region 3 to the channel 7. The diffusions are carried out in a manner known to those skilled in the art.

As the skilled person will appreciate, it is possible to form features described to use a p-diffusion with an n-diffusion and vice versa to obtain an p-channel FET instead of a n-channel FET.

The drift region 9 is formed from a graded n+ diffusion, in which the concentration is linearly graded with a higher concentration adjacent to the drain. The drift region 9 is formed as described in U.S. Pat. No. 5,300,448 issued Apr. 5, 1994. In this process, phosphorous ions are implanted through a mask having a plurality of openings of different sizes to dope the silicon with a laterally varying dopant concentration. Then, an annealing step is carried out to obtain a uniform gradient of doping level.

In order to mask the rest of the silicon layer during the formation of the graded drift region a temporary silicon nitride layer 10 is formed on the device before carrying out the diffusion to form the graded drift region. The temporary silicon nitride layer 10 is etched away.

The linear grading in the drift region 9 may allow a higher voltage to be handled by the finished device without the structure breaking down than using a drift region of constant doping. However, the linear grading is not essential and in a modification of the invention the drift region 9 may have a different doping profile, for example a constant doping concentration.

In practice the graded drift region 9 may be formed first, followed by the channel and the source and drain diffusions. In this way, the annealing step diffusing the phosphorous implanted in the drift region does not cause excessive diffusion of other dopant implants.

Figure 2B:
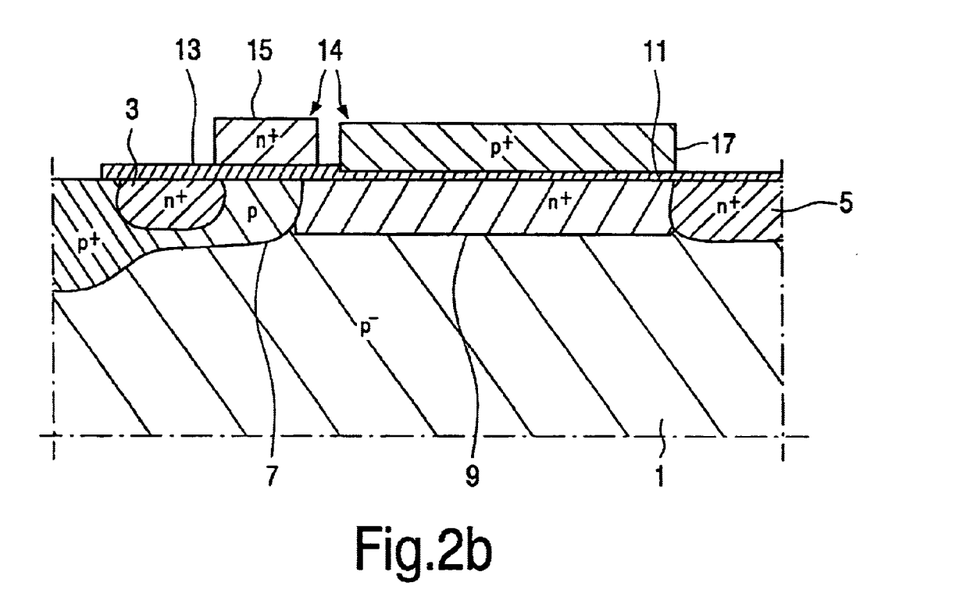

Referring to FIG. 2b, a capacitance oxide layer 11 and a gate oxide layer 13 are formed over the surface of the substrate. The oxide layers 11, 13 need not, in general, be the same thickness as each other.

A polysilicon layer 14 is deposited over the capacitance oxide layer 11 and the gate oxide layer 13 and then patterned to define a gate electrode 15 over the channel 7 and a field plate 17 over the drift region 9. The gate electrode is separated from the channel by the gate oxide layer 13 and the field plate 17 is separated from the drift region by the capacitance oxide layer The polysilicon 14 is then doped to be conductive. In the embodiment shown, the gate electrode is of n+ doped polysilicon but alternatively the gate electrode may be formed of any suitable conducting material. The field plate is of n+ doped polysilicon, which allows it to be doped in the gate doping step. As an alternative p+ doped polysilicon may be used for field plate 17. However, this means that an additional doping step is required, since the field plate 17 cannot then be doped in the same step as the n+ polysilicon of the gate electrode 15.

The thickness of the capacitance oxide layer 11 is chosen depending on the level of reduced surface field (RESURF) required.

Figure 2C:
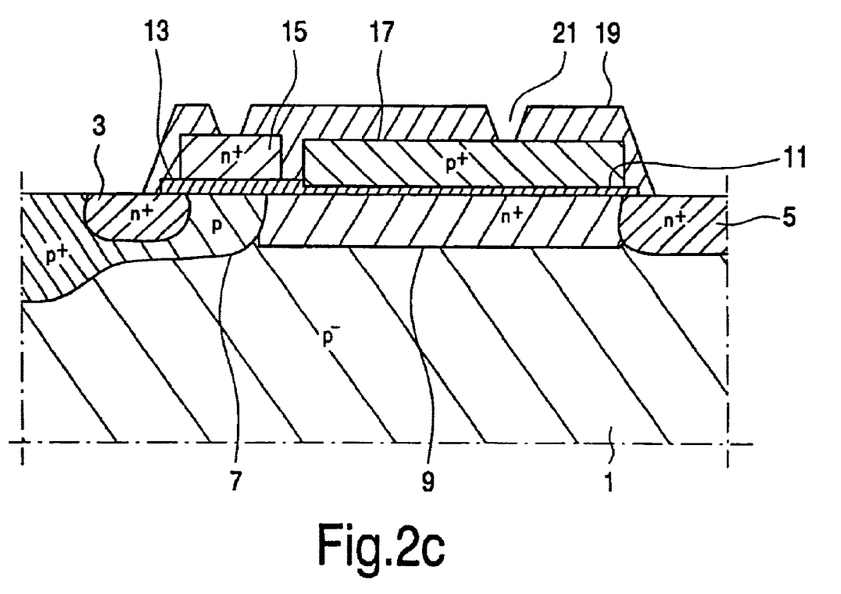

Referring to FIG. 2c, a protective oxide layer 19 is formed to cover the gate electrode 15, the field plate 17 and parts of the surface of the substrate 1. Via holes 21 are formed in the protective oxide layer 19.

Figure 2D:
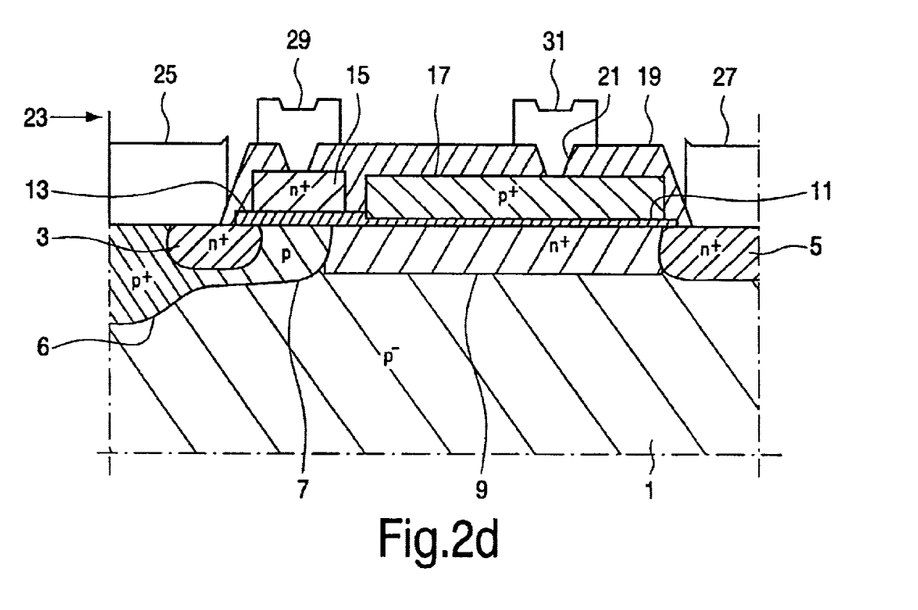
Figure 3:
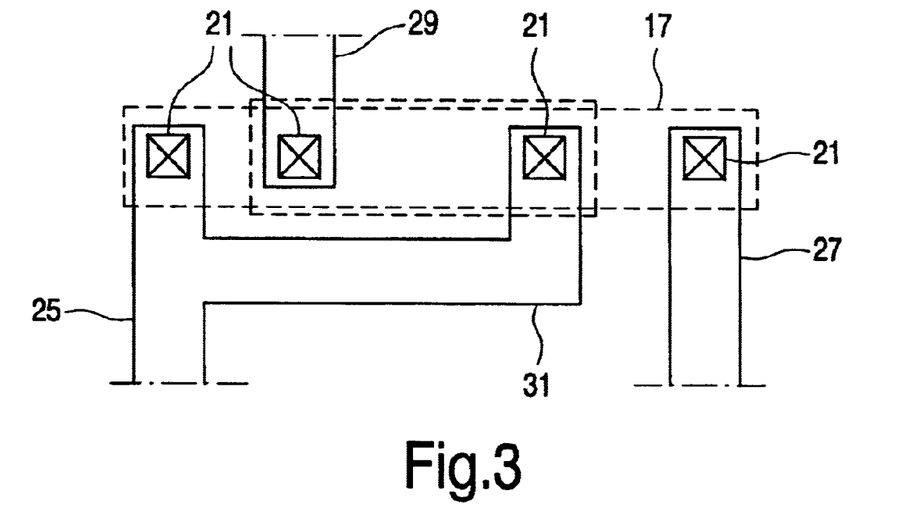
FIG. 3 shows a top view of the device shown in FIG. 2.

Referring to FIG. 2d, a metallisation layer 23 is deposited over the protective oxide layer 19 and in the via holes 21. The metallisation layer is patterned to provide a source contact 25 in contact with the source region 3 and the highly doped region 6, a drain contact 27 in contact with the drain region 5, and a gate contact 29 in contact with the gate electrode 15 through a via hole 21. The metallisation layer 23 has a connection 31 extending from the source contact 25 to connect to the field plate 17, as shown in FIG. 3, so that the field plate 17 is connected to the source 3 through a low resistance connection.

In use, the transistor is controlled by the voltage applied to the gate electrode 15, in a manner well known in the field of semiconductor devices. The device according to the embodiment shown can handle a significant voltage between source 3 and drain 5 because much of the voltage is dropped across the drift region 9 leaving a much lower voltage order dropped in the channel region 7. By way of example, 200 V between source and drain can give rise to only 20 V between the source 3 and the other end of the channel 7 adjacent the drift region 9.

The source-connected field plate 17 which is separated from the drift region 9 by the thin capacitative oxide layer 11 provides an effective electrical shield between the gate electrode 15 and the drain 5. This shield reduces the capacitance $C_{gd}$ between the gate electrode 15 and the drain 5. Accordingly, the charge $Q_{gd}$ that needs to be delivered to develop a given voltage between the gate electrode 15 and the drain 5 is likewise reduced. This increases the switching speed of the device and so increases the frequency response of the device.

In conventional circuit arrangements, the input capacitance at the gate electrode 15 is the sum of the gate-source capacitance $C_{gs}$ and the Miller capacitance, $C_M=(1+g_M R_L) C_{gd}$, where $R_L$ is the load resistance and $g_M$ the transconductance. This means that the switching speed is dominated by the contribution from $C_{gd}$ so that the device according to the invention has an improved switching speed, in spite of any increase the gate source capacitance $C_{gs}$ caused by capacitance between the field plate 17 and the gate electrode 15.

The source connected field plate 17 may, when the device is switched off, cause depletion of the drift region 9. Complete depletion of the drift region 9 means that the device has a reduced surface field (RESURF) so that a higher voltage may be applied between source 3 and drain 5 without having too high a field at some part of the drift region 9 and so causing avalanche breakdown.

A further feature of the invention is that the backside of the substrate 1 may be biased at source potential to assist in switching the device off. The drift region 9 will be depleted; the depletion region extending to the n+ drain. A backside contact (not shown) may be provided on the rear of the substrate 1 to provide a connection to the substrate 1.

The structure disclosed may deliver low on-state resistance in addition to the quick switching and high breakdown voltage discussed above.

Further, the structure described can be manufactured with little increase in process complexity compared with existing structures. Indeed, no additional mask steps are required in embodiments in which the field plate 17 is formed from the same material as the gate electrode 15. Only one additional mask step is required for embodiments in which the field plate 17 is formed from a different material to the gate electrode 15.

As those skilled in the art will appreciate it is also possible, in a modification of the invention, to provide a p-channel device, by providing an n-type doped channel region 7 and p type source 3 and drain 5.

In a second embodiment of the invention, illustrated in FIG. 4, a silicon on insulator structure is used. Like components are given like reference numerals.

Figure 4A:
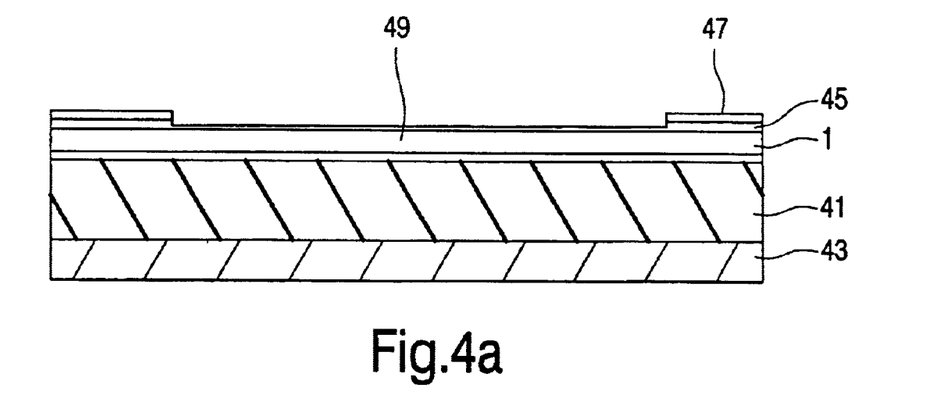
FIG. 4 shows a side view of a device according to a second embodiment of the invention.

Referring to FIG. 4a, the first step in the manufacture of a device according to the invention is to form a buried oxide layer 4 and a silicon body layer 1 on a semiconductor substrate 43. This is done by bonding a silicon wafer on a silicon substrate 43 and thinning the wafer to form the silicon layer 1. Oxide layers on the face of the silicon substrate 43 and the silicon layer 1 placed face to face form the buried oxide layer 41.

Alternatively other techniques for forming the buried layer structure may be used, for example by depositing or growing an oxide layer 41 followed by a silicon layer 1 on a substrate.

Next a thin screen oxide layer 45 is grown, to a target thickness of 550 Å. Then, an initial implant is performed, which provides background phosphorous doping in the upper part 49 of the silicon layer. The doping is carried out to a dose of $1.4 \times 10^{12}$ cm$^{-2}$ and the implantation is carried out at 160 keV.

Then, a 1400 Å thick LPCVD nitride layer 47 is deposited directly onto the screen oxide layer 45. This has two functions—it provides the mask for the subsequent LOCOS oxidation and further provides an additional screen for the subsequent n-well implant.

Following deposition, the nitride layer 47 is patterned using photolithography and dry etching. Some erosion of the underlying screen oxide layer 45 occurs in the dry etching step, which results in the structure shown in FIG. 4a. Therefore, the screen oxide is removed with a dip etch in 7:1 HF and an new screen oxide layer 45 grown to the same thickness as before.

Figure 4B:
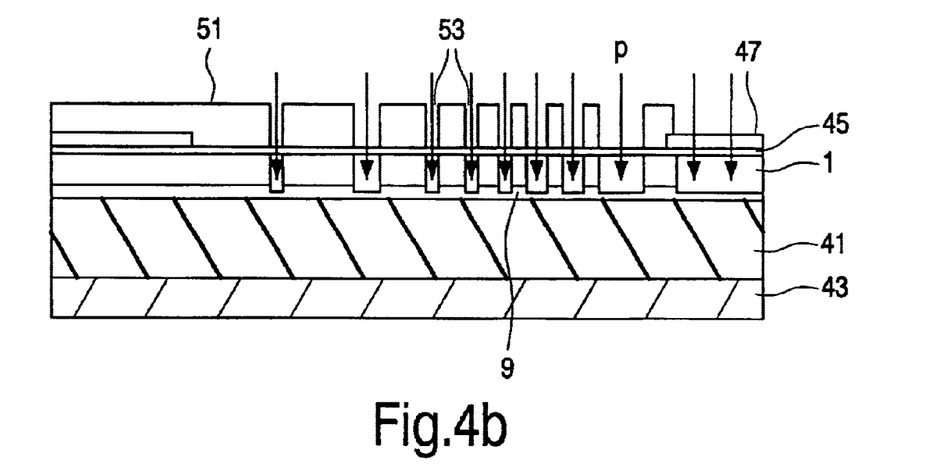

A graded drift region 9 is then formed in the silicon layer 1 (FIG. 4b). The formation of this graded drift region 9 is carried out as described in U.S. Pat. No. 5,300,448 issued Apr. 5, 1994. In this process, a mask 51 is patterned and to have a plurality of openings 53 of different sizes. Phosphorous is then implanted to dope the silicon with a laterally varying dopant concentration. An annealing step is carried out to obtain a substantially uniform gradient of doping level in the graded drift region 9.

A local oxidation on silicon (LOCOS) process is then carried out to thin the graded drift region 9 and to grow a LOCOS oxide layer 11 above the drift region. Firstly, an acid preclean is performed, and then the LOCOS layer 11 is grown. This consumes 1 μm of silicon, and produces 2.2 μm of oxide. The nitride layer 47 functions as the LOCOS mask.

The nitride layer 47 is then removed by a wet etch, to remove any surface oxynitride, followed by a dry etch. Then, the screen oxide layer 45 is removed by a 30 s dip etch, to arrive at the structure of FIG. 4c.

Figure 4C:
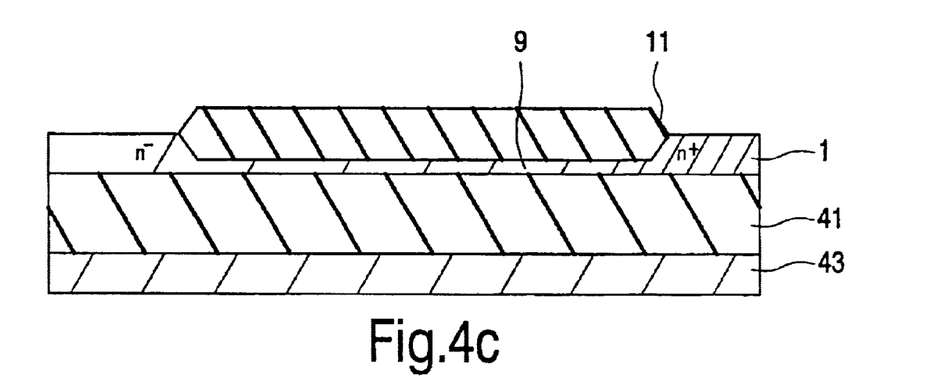

The surface is not at this stage suitable for gate oxidation because of the "birds beak" effect at the edge of the LOCOS layer 17. Thus, the surface layer is removed by sacrificial oxidation followed by a 45 second 7:1 HF dip etch.

Figure 4D:
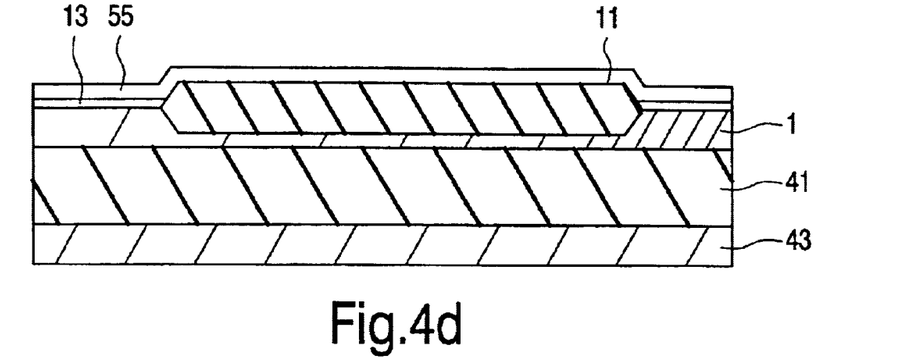

A thin gate oxide layer 13 of target thickness 800 Å is then grown over the p-type body 7 and the end of the drift region. A polysilicon layer 55 is then formed to a thickness of 11 250 Å over the gate oxide layer 13 and the LOCOS layer 11 (FIG. 4d). The polysilicon layer 55 is then doped in a furnace with $POCl_3$ to saturation. This reduces the resistance of the polysilicon layer to around 10Ω/square.

Figure 4E:
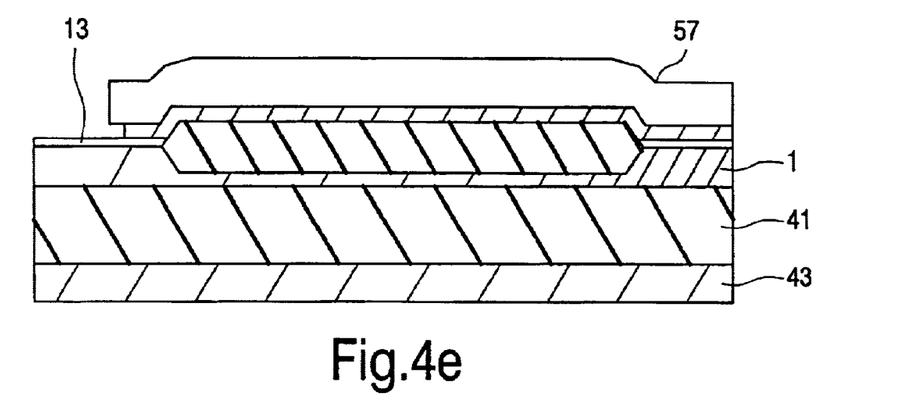

Next, a 2 μm thick resist layer 57 is formed, and patterned to leave the source region clear of resist, whilst protecting the rest of the structure (FIG. 4e). A two stage etch process removes the material above the source region. Firstly, a vertical dry etch is performed to etch to the top of the gate oxide, followed by an over etch which removes resist from below the edge of the mask with an undercut of 2 μm.

Figure 4F:
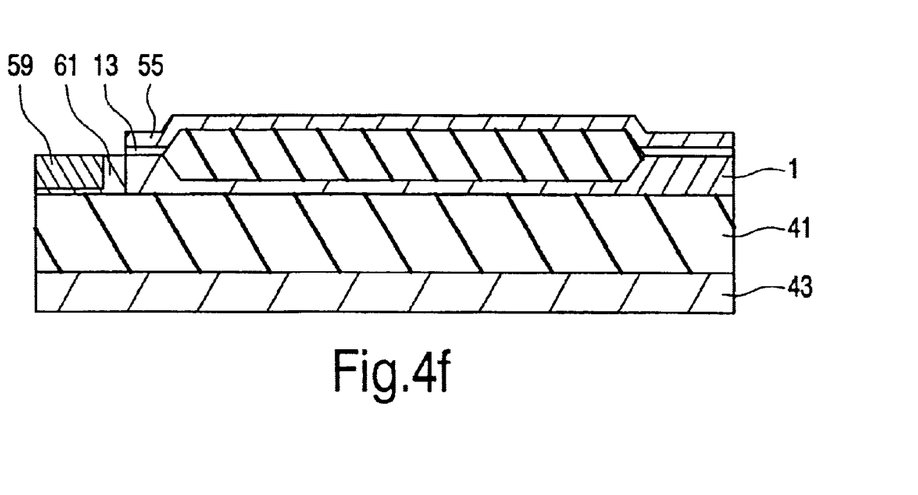

An ADP implant is then performed to provide a high doping density p-type body region 59 (FIG. 4f). The resist is then stripped, and a low doping density implant 61 performed. The low doping density implant forms the lightly doped p body implant self aligned to the edge of the gate polysilicon. Next, the gate oxide layer 13 is stripped from the source region.

A p-body anneal diffuses the dopant atoms from the lightly p-doped body under the polysilicon gate to form the channel 7. In this step, a screen oxide layer 45 is also grown on the source region.

Figure 4G:
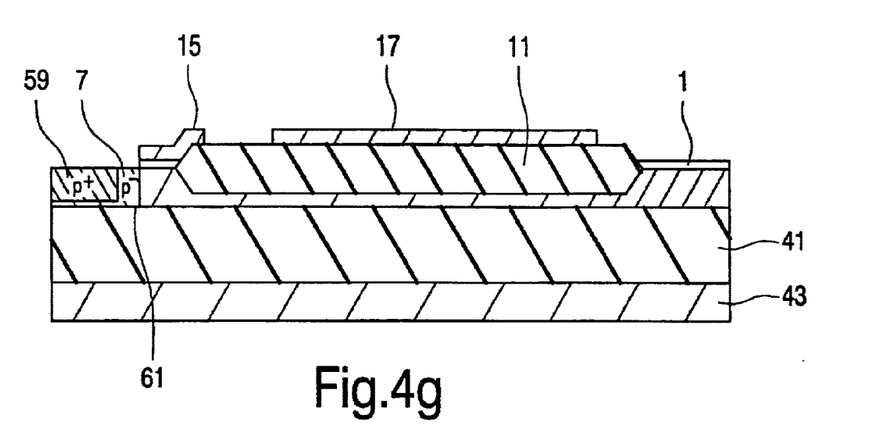

A dry etch process using a photolithographically defined mask removes the polysilicon layer 55 where not required, and to define a field plate 17 separated from the gate electrode 15. Also, polysilicon is removed from the drain region. However, since the source region is already patterned, the mask covers the source region during this step. A screen oxide layer 45 is then grown on the exposed drain region.

Figure 4H:
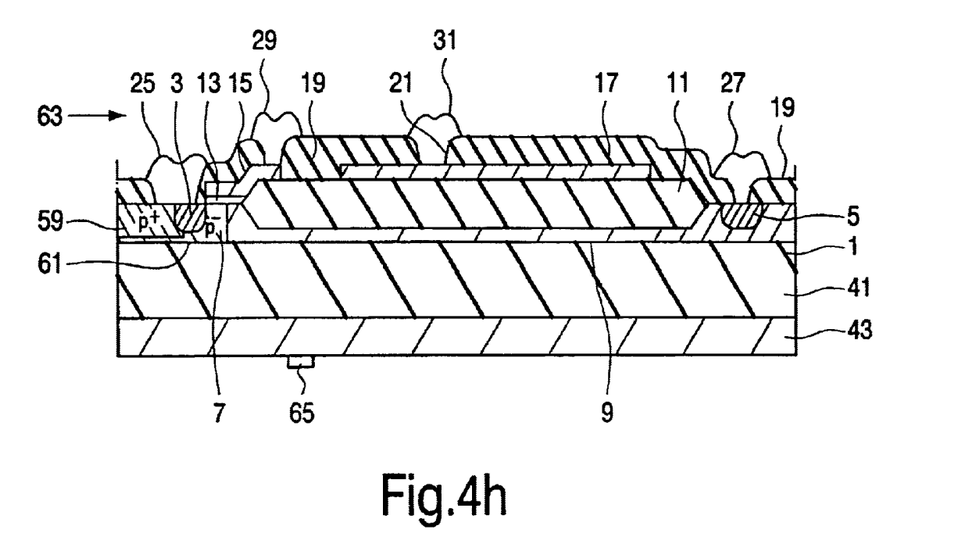

Referring to FIG. 3h, a further n+ diffusion is then performed to define the source 3 and drain 5 regions.

A further oxide layer 19 is then formed on the surface from tetra-ethyl-ortho-silicate (TEOS, also known as tetra-ethoxy silane), as is known. A plurality of contact vias 21 is formed in the TEOS oxide layer 33. A metallisation layer 63 is deposited on the TEOS layer, to form source 25, gate 29 and drain 27 connections. The source connection 25 extends to connect to both the source diffusion 9 and the field plate 25 via a field plate contact 21.

A backside contact 65 is provided on the rear of the substrate to allow electrical connection to be made to the substrate.

The skilled person will appreciate that processing does not stop with the arrangements of FIGS. 2c and 4h but further steps may be performed as required. For example, the structure may be passivated, a wafer on which the devices are made may be scribed to form individual dies, and such other steps may be carried out as required.

The structure requires only a single polysilicon layer above the gate oxide and the LOCOS oxide which eases manufacture.

The SOI structure inherently has a low $C_{gd}$ and hence a low $Q_{gd}$ and rapid switching time, and the source-connected field plate 17 improves this in like manner to that of the first embodiment.

The device is also a RESURF structure. The source voltage may be applied to the backside contact 65 as well as to the field plate 17 so that the drift region 9 is wholly depleted when the device is switched off. This again allows a high voltage to be applied between source and drain without causing breakdown. It may be possible to dope the drift region with a higher doping density and still wholly deplete the drift region when the device is turned off by depleting the drift region from both sides rather than just one side. This in turn can reduce the on-resistance of the device.

The p+ region 59 near the source may improve the ruggedness of the structure. Further, it can act as an ohmic contact to the body 61.

In a modification of the invention, the field plate and gate electrode are not formed of doped polysilicon, but of other conducting material, such as aluminum, silicide, or a combination layer such as polycide. The skilled person will be aware of further alternatives.

The gate insulation and field plate insulation need not be of oxide, but may be of other suitable materials, such as nitride.

The semiconductor used is not restricted to silicon, but may also be Gallium Arsenide, or any other suitable semiconductor.

What is claim is:

1. An insulated gate field effect transistor, comprising:

a source region and a drain region laterally spaced in a semiconductor layer;

a drift region adjacent to the drain region in the semiconductor layer between the source region and the drain region;

a channel having a conductivity opposite that of the source region and the drift region and arranged in the semiconductor layer between the source region and the drift region;

an insulated gate electrode arranged over the channel;

a field plate arranged over the drift region separated from the drift region by a capacitance oxide layer;

an electrical interconnection between the source region and the field plate to electrically connect the source region and the field plate; and a semiconductor substrate having the same conductivity as the channel and upon which the drain region, drift region and channel are formed.

2. An insulated gate field effect transistor according to claim 1 wherein drift region has a laterally varying dopant concentration gradient, with a higher dopant concentration adjacent to the drain region and a lower dopant concentration adjacent to the channel.

3. An insulated gate field effect transistor according to claim 2 wherein the dopant concentration in the drift region varies linearly across the drift region.

4. An insulated gate field effect transistor according to claim 1 wherein the doping concentration and the thickness of the drift region are such that the drift region is depleted throughout its thickness and along its length when the transistor is turned off.

5. An insulated gate field effect transistor according to any preceding claim in which the source, channel, drift region and drain are doped regions of the semiconductor substrate.

6. An insulated gate field effect transistor according to claim 5 having a p⁻ substrate, a p channel, an n⁺ source region, an n⁺ drain region and an n⁺ drift region.

* * * * *